(12) United States Patent
Momose et al.

(10) Patent No.: US 6,552,352 B2
(45) Date of Patent: Apr. 22, 2003

(54) ALIGNER

(75) Inventors: Katsumi Momose, Tokyo (JP); Masatoshi Asami, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/115,496

(22) Filed: Apr. 2, 2002

(65) Prior Publication Data
US 2002/0166978 A1 Nov. 14, 2002

(30) Foreign Application Priority Data
May 10, 2001 (JP) ........................................ 2001-140430

(51) Int. Cl.[7] ............................ G01J 1/00; G01N 21/00; G01N 23/00
(52) U.S. Cl. ...................... 250/491.1; 378/63; 378/205; 378/207; 378/162
(58) Field of Search .................... 250/491.1; 378/63, 378/205, 207, 162

(56) References Cited

U.S. PATENT DOCUMENTS 3,984,680 A * 10/1976 Smith .......................... 250/272

* cited by examiner

Primary Examiner—Bruce Anderson
Assistant Examiner—James Leybourne
(74) Attorney, Agent, or Firm—Nields & Lemack

(57) ABSTRACT

The invention provides an aligner enabling to perform high accuracy positioning at manufacturing a multi-layered circuit board. A board alignment mark is photographed by a CCD camera by irradiating X-ray from an X-ray generator at the state removing a photo mask, and position of the board alignment mark is memorized. Then, the photo mask is set on a print circuit board, a mask alignment mark is photographed, and positioning of the mask alignment mark and the print circuit board is performed by comparing with position of memorized board alignment mark and by moving a platen so that the gap becomes zero.

13 Claims, 4 Drawing Sheets

ALIGNER

BACKGROUND OF THE INVENTION

1. Field of the Invention

The present invention relates to an aligner.

2. Prior Art

In recent years, print circuit boards go on fineness with lightness, thinness, shortness, smallness, and high function of products typified by a portable telephone. Especially, in order to increase numbers of electric parts mounted on the board, a board by a manufacturing method called build-up, which is formed on whole faces called through-hole hitherto, and which has no hole is on the market. This board forms resin insulation layers and conductive patterns of copper alternately in order on top and bottom of inserted layer board called core board. Conductivity between layers is made by forming a hole called via hole and plating copper.

Here, at forming a pattern of a build-up layer formed on top and bottom of the core board, it is need to perform positioning of alignment mark on the core board and alignment mark set on a photo mask for build-up layer in order to make sure of mutual position relation of the pattern already formed on the core board and the pattern of build-up layer.

However, whole faces are covered by copper foil before pattern forming of the build-up layer, so the alignment mark on the core board is not seen usually.

Because of that, hitherto, in method forming copper foil of the build-up layer, method putting masking tape on and taking it off after plating is adopted so that plating is not attached at part corresponding to a mark on the core board. As another method, there is a method using holes for a mark of the core board without using the pattern. In the method, it is need to prevent resin from invading into the core board or to remove the resin invaded so that the hole is covered at next plating when resin insulation layer of the build-up layer is applied. In the method forming by putting copper foil, process is difficult because copper foil portion is etched once and is removed so as to be neck for efficiency of process.

In order to solve the above-mentioned problem, applicant of the invention developed technique of positioning by reading an alignment mark on a board formed on a core board using X-ray. However, at using the X-ray, there is a problem that composition of photo mask changes by the X-ray and transparency of part irradiated by the X-ray deteriorates especially in the case of glass photo mask.

An object of the invention is to aim for new improvement about the above-mentioned aligner positioning by using the X-ray.

SUMMARY OF THE INVENTION

To achieve the above-mentioned object, the invention is characterized by comprising: a photo mask enabling to arrange at one side of a board forming a multi-layered circuit and drawing conductive patterns formed on the board; a board alignment mark formed on at least one layer of the board and enabling to photograph by an X-ray; a mask alignment mark drawn on the photo mask; an X-ray generator irradiating X-ray to an area including said board alignment mark; means for removing the photo mask out of X-ray irradiation range of the X-ray generator; a projecting member enabling to convert the X-ray to visible light, ultraviolet rays, or infrared rays and to which an image of the board alignment mark irradiated using the X-ray is projected; a unit detecting position of the board alignment mark projected to the projecting member; a unit detecting position of the mask alignment mark of the photo mask at the state being arranged at one side of the board; a moving unit for moving one of the board and the photo mask or both so that positioning of the board and the photo mask is performed based on the detected board alignment mark and mask alignment mark; and an exposure light source exposing a pattern drawn on the photo mask after the positioning onto the board in the aligner for manufacturing a multi-layered printed circuit board having plural insulation layers and plural conductive layers drawing conductive patterns.

In the above-mentioned constitution, it is possible to project image of the board alignment mark formed on the core board to the projecting member using X-ray so as to perform positioning of the board and the photo mask based on the board alignment mark and the mask alignment mark.

Moreover, because the photo mask can be removed out of X-ray irradiation of the X-ray generator range, change of composition of the photo mask by the X-ray can be prevented.

The aligner further comprises means for obtaining position relation from the detected positions of the board alignment mark and mask alignment mark and detecting a gap from previously determined position relation and it is possible to perform positioning of the board and the photo mask based on the gap. For example, the board alignment mark and the mask alignment mark may be moved so as to meet. The moving is possible to move one of the board and the photo mask or both. The control of the moving unit may be performed automatically or manually.

In the preferred embodiment, the aligner further comprises means for memorizing position of the detected board alignment mark, the moving unit moves one of the board and the photo mask or both based on the memorized board alignment mark and the detected mask alignment mark. Even in this case, it is possible to detect a gap based on position relation of the memorized board alignment mark and the detected mask alignment mark.

It is possible to provide means for memorizing position of the board besides the board alignment mark, to set an imaginary board, to memorize position of the board alignment mark in relation to the memorized board, and to set the position of the board alignment mark on the imaginary board. In this case, the moving unit moves one of the board and the photo mask or both based on the board alignment mark on the imaginary board and the detected mask alignment mark. It is possible even that a gap is detected based on position relation of the board alignment mark set on the imaginary board and said detected mask alignment mark. The aligner further comprises a unit displaying the detected positions of the board alignment mark and mask alignment mark as image, one of the board and the photo mask or both may be moved so that the board alignment mark and the mask alignment mark become previously determined position relation based on the displayed image.

In the case setting the imaginary board, the imaginary board and the photo mask are displayed as image. Even in this case, it is possible that the moving unit moves one of the board and the photo mask or both so that position relation of the board alignment mark on the imaginary board and the mask alignment mark becomes designated position relation. The unit detecting the board alignment mark and the unit detecting the mask alignment mark include a CCD camera usually, and positions of the board alignment mark and the mask alignment mark are detected based on image signal photographed by the camera.

The above-mentioned constitution has advantage when the photo mask is a glass mask or a glass putting a photo mask of film base.

DETAILED DESCRIPTION OF PREFERRED EMBODIMENTS

An embodiment of the invention will be described below referring figures.

Figure 1:
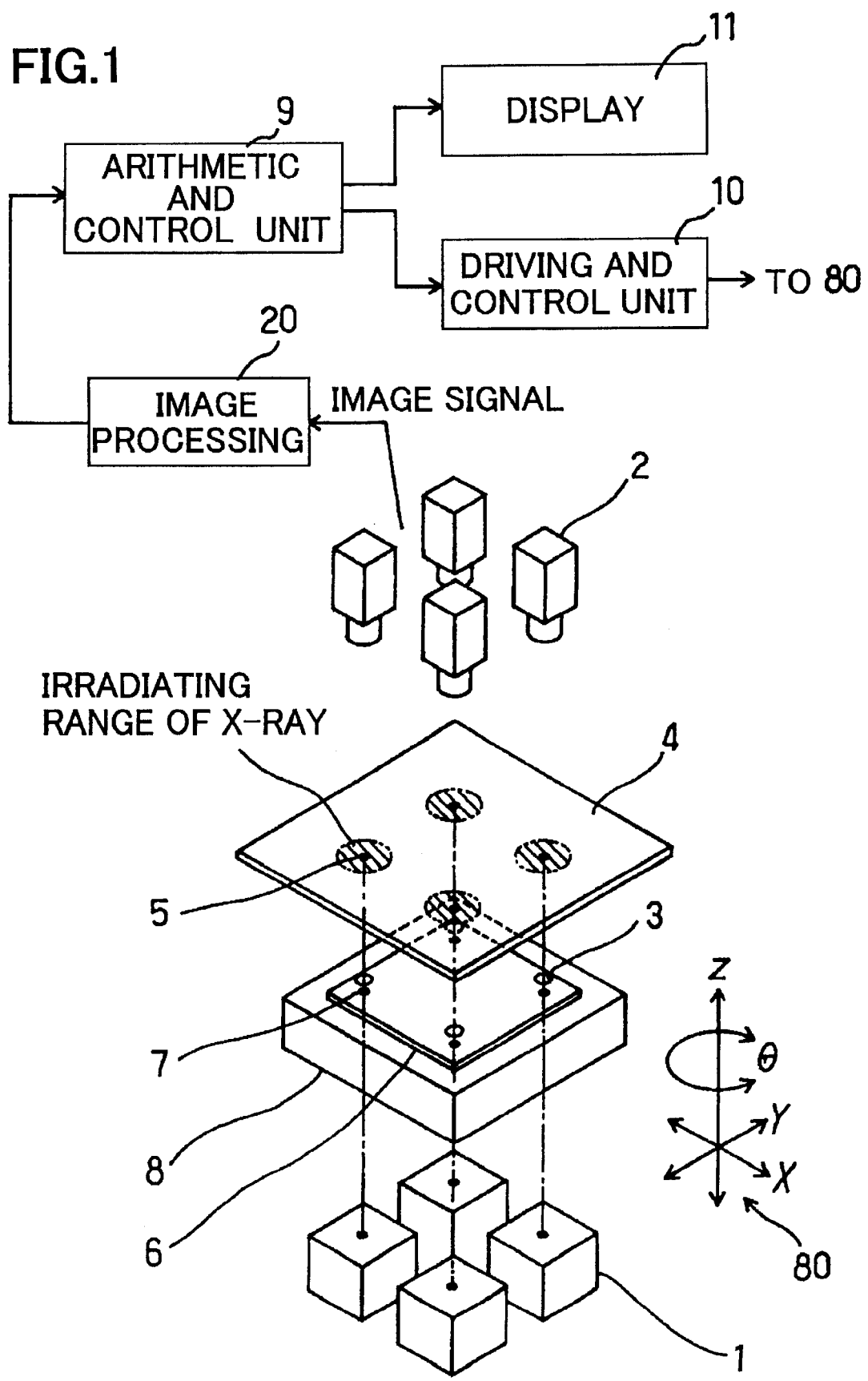
FIG. 1 is a perspective view of an outline showing an embodiment according to the invention.

In FIG. 1, a photo mask 4 where patterns of the circuit are drawn is brought near on a print circuit board 6 or adheres to the print circuit board 6, and the patterns of circuit are printed on the print circuit board 6 by exposing using light source of exposure (not shown) through the photo mask 4.

In the case of multi-layered board, the operations of the exposure are repeated times of numbers of layers.

At the exposure, positioning of the photo mask 4 and print circuit board 6 is performed. The print circuit board 6 is set on a platen 8, and is movable to XYZ and θ directions by a moving mechanism 80. Board alignment marks 7 are formed on the print circuit board 6, mask alignment marks 5 are drawn on the photo mask 4, the board alignment marks 7 and the photo mask 4 are photographed by CCD cameras 2, and positioning is performed by moving the platen 8 so as to meet.

When the print circuit board 6 is a multi-layered board, the board alignment mark 7 is not caught with visible light because of a layer put on the layer where the board alignment mark 7 is formed (usually core board of the lowest layer). Because of that, X-ray generators 1 are set at under side of the platen 8, fluorescent body 3 are set between the print circuit board 6 and the photo mask 4, X-rays are irradiated from the X-ray generators 1, and image of the board alignment mark 7 are caught by the X-rays so as to project the image on fluorescent body 3.

Fluorescent paint is applied at the photo mask 4 side of the fluorescent body 3, the X-rays are converted to visible light here, and images of the board alignment marks 7 are projected on the surfaces of fluorescent body 3. Images projected on the fluorescent body 3 are photographed by the CCD cameras 2 to perform positioning.

However, the X-rays from the X-ray generators 1 are irradiated even to the photo mask 4 at the same time. Parts of diagonal lines near the mask alignment marks 5 in the figure are irradiating ranges. It became clear by research of the inventors that such the X-ray irradiation occurs composition change at the part. That is, when the photo mask 4 is glass or when photo mask of film base is put on glass, change such that the photo mask 4 is colored gradually occurs. Because of that, problems that it takes long time for image recognition of the alignment mark or that accuracy decreases occur. Problems that serious coloration needs change of said glass mask and the like occur.

Figure 2:
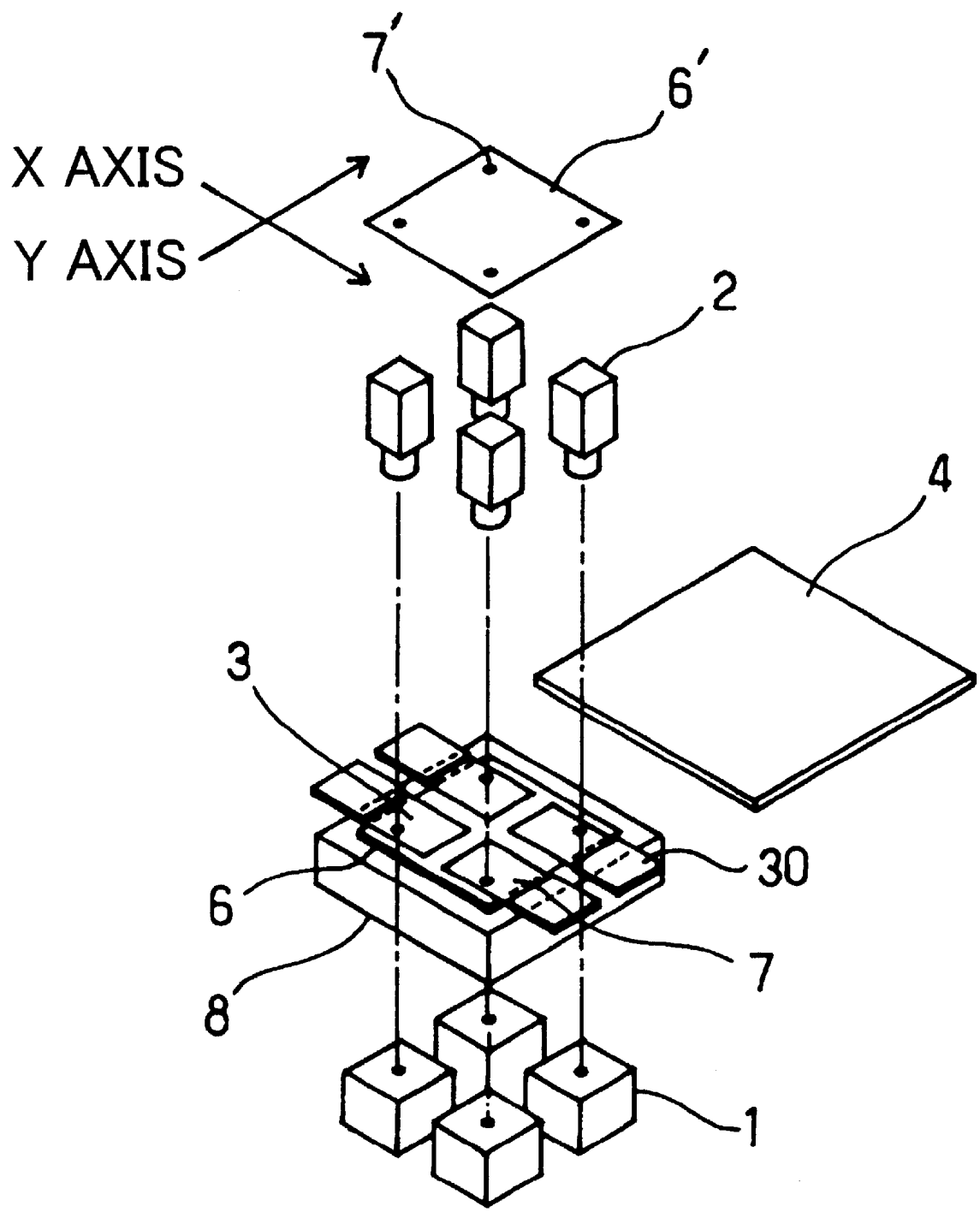
FIG. 2 is a perspective view of an outline showing operation of the embodiment according to the invention.

In order to solve the problems, the photo mask 4 is not arranged on the print circuit board 6 as shown in FIG. 2 when the X-rays are irradiated from the X-ray generators 1. That is, positions of the board alignment marks 7 are memorized once by an arithmetic and control unit 9 composed of a microcomputer mainly after photographing by the CCD cameras 2 and processing by an image processing unit 20. In the embodiment, setting an imaginary print circuit board 6' as shown in FIG. 2, positions of print circuit board alignment marks 7' are recorded there.

Figure 3:
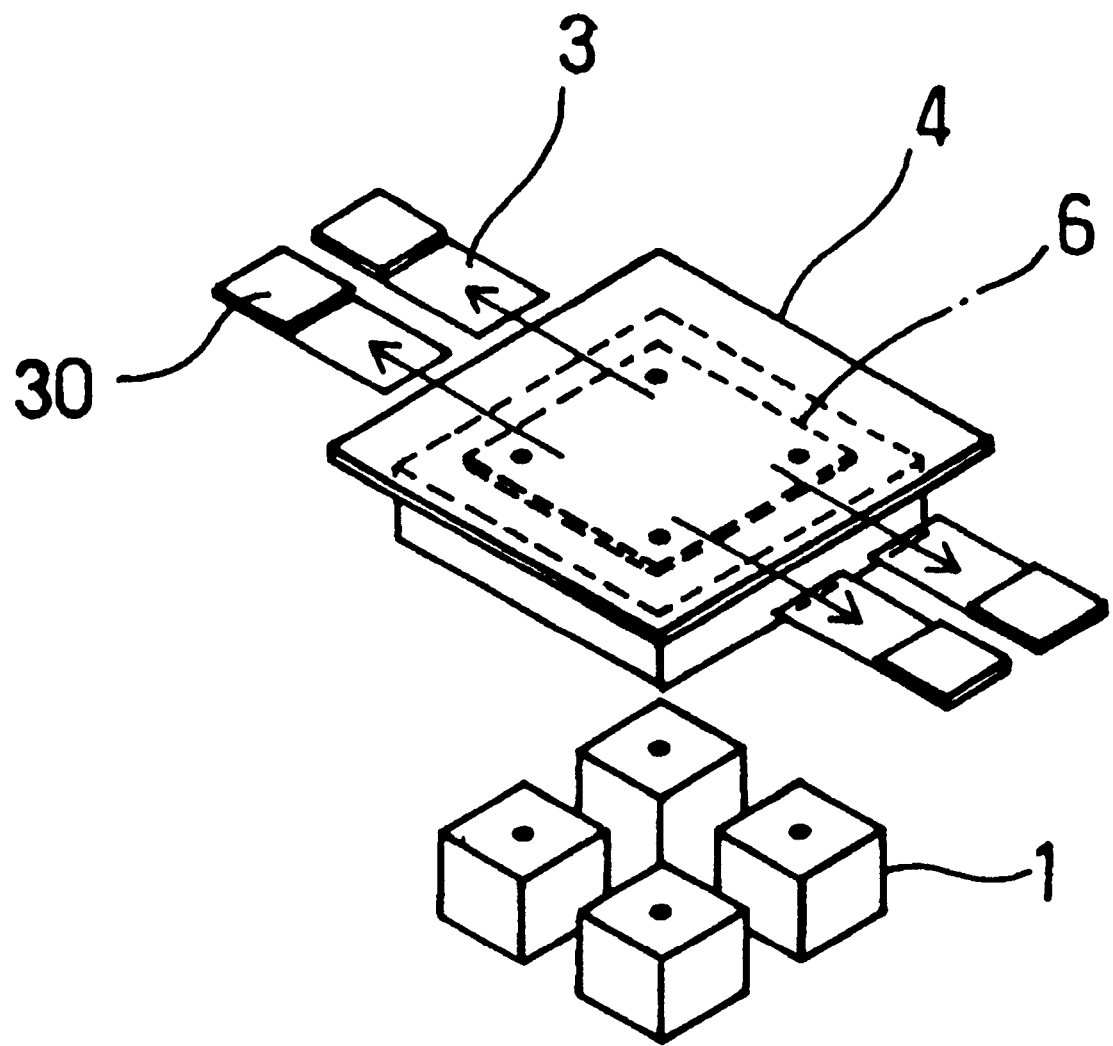
FIG. 3 is a perspective view of an outline showing operation of the embodiment according to the invention.
Figure 4:
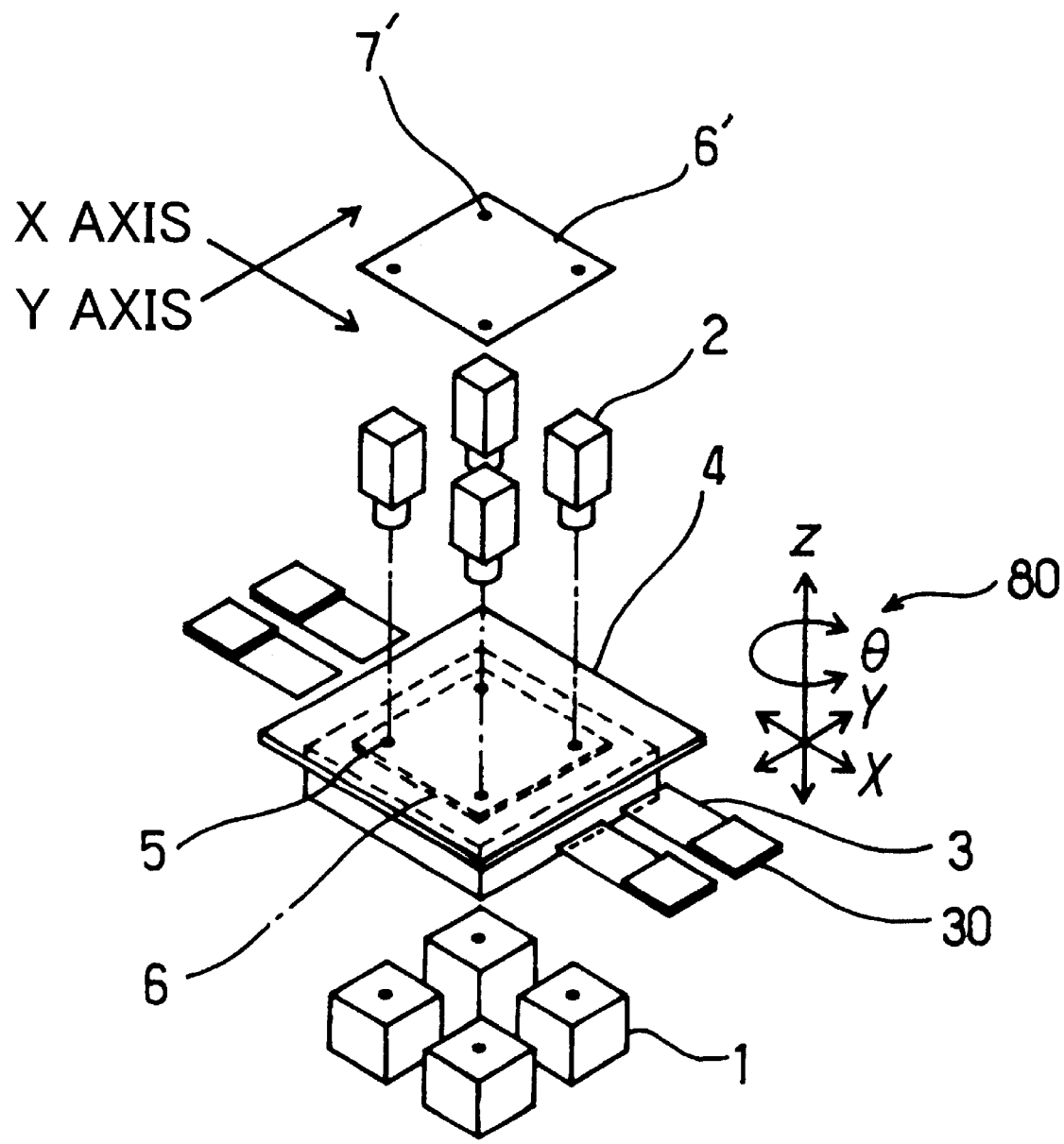
FIG. 4 is a perspective view of an outline showing operation of the embodiment according to the invention.

Next, after the photo mask 4 is set on the print circuit board 6 and the fluorescent body 3 are removed by a moving unit 30 as shown in FIG. 3, the mask alignment marks 5 of the photo mask 4 are photographed by the CCD cameras 2 as shown in FIG. 4. A gap of positions between the mask alignment marks 5 and board alignment marks 7' is obtained by the arithmetic and control unit 9, a moving mechanism 80 is driven through a driving and control unit 10 so that the gap is made zero, and position of the platen 8 is adjusted.

The above-mentioned operation may be performed automatically or manually. In the manual operation, a display unit 11 is set, the board alignment marks 7' on the imaginary print circuit board 6' and the mask alignment marks 5 are displayed at the display unit 11, and an operator performs positioning watching image.

After finishing positioning the print circuit board 6 and the photo mask 4, exposure is performed by irradiating light from an exposure light source (not shown), and the above-mentioned operation is repeated at exposure of each layer hereafter.

Although position relation of the platen 8, the print circuit board 6, the photo mask 4, CCD cameras 2, and the like is described as relation of top and bottom direction, it is not limited to the relation, and even arrangement of horizontal direction is possible.

In the above constitution, when the board alignment marks 7 are photographed by irradiating X-rays from the X-ray generators 1, the X-rays are not irradiated to the photo mask 4 because photographing is performed in the state that the photo mask 4 is not positioned on the print circuit board 6 as shown in FIG. 2, so that the component of the photo mask 4 does not change occur by the X-rays. Because of that, even if the photo mask 4 is a glass mask or a glass mask putting a photo mask of film base, there is not any problem of coloring. Since the positioning is performed based on gap of the board alignment marks 7' of the imaginary print circuit board 6' and the mask alignment marks 5, the same accuracy can be kept similarly as the case that the positioning is performed directly by the board alignment marks 7 on the fluorescent body 3 and the mask alignment marks 5.

As described above, according to the aligner of the invention, positioning of the print circuit board 6 and the photo mask 4 at manufacturing multi-layered board is performed effectively by using X-ray, further the aligner has an advantage removing change of composition of the photo mask caused by X-ray irradiation.

What is claimed is:

1. An aligner for manufacturing a multi-layered circuit board having plural insulation layers and plural conductive layers drawing conductive patterns, comprising:

a photo mask enabling to arrange at one side of a board forming a multi-layered circuit and drawing conductive patterns formed on the board;

a board alignment mark formed on at least one layer of said board and enabling to photograph using an X-ray;

a mask alignment mark drawn on the photo mask;

an X-ray generator irradiating X-ray to an area including said board alignment mark;

a unit removing the photo mask out of X-ray irradiation range of the X-ray generator;

a projecting member enabling to convert the X-ray to visible light, ultraviolet rays, or infrared rays and to which an image of the board alignment mark irradiated using the X-ray is projected;

a unit detecting position of the board alignment mark projected onto the projecting member;

a unit detecting position of the mask alignment mark of the photo mask at the state being arranged at one side of the board;

a moving unit moving one of the board and the photo mask or both so that positioning of the board and the photo mask is performed based on the detected board alignment mark and mask alignment mark; and an exposure light source exposing a pattern drawn on the photo mask after the positioning.

2. An aligner according to claim 1, further comprising means for detecting a gap from previously designated position by obtaining position relation from positions of the board alignment mark and mask alignment mark, wherein the moving unit moves one of the board and the photo mask or both based on the gap of the position relation to perform positioning of the board and the photo mask.

3. An aligner according to claim 2, further comprising a unit memorizing position of the detected board alignment mark, wherein the unit detecting gap detects a gap based on position relation of the memorized board alignment mark and the detected mask alignment mark.

4. An aligner according to claim 2, wherein the unit detecting gap detects a gap based on position relation of the board alignment mark memorized in relation to the memorization board and the detected mask alignment mark.

5. An aligner according to claim 1, further comprising means for memorizing position of the detected board alignment mark, wherein the moving unit moves one of the board and the photo mask or both based on the memorized board alignment mark and the detected mask alignment mark.

6. An aligner according to claim 1, further comprising a unit memorizing position of said board and a unit memorizing position of the detected board alignment mark in relation to the memorized board.

7. An aligner according to claim 1, wherein the moving unit moves one of the board and the photo mask or both based on the board alignment mark memorized in relation to the memorized board and the detected mask alignment mark.

8. An aligner according to claim 1, further comprising a unit displaying the detected board alignment mark and mask alignment mark as image, wherein the moving unit moves one of the board and the photo mask or both so that the detected board alignment mark and the mask alignment mark become previously determined position relation based on the displayed image.

9. An aligner according to claim 8, wherein the unit displaying displays the board alignment mark memorized in relation to the memorized board and the detected mask alignment mark as image.

10. An aligner according to claim 9, wherein the moving unit moves one of the board and the photo mask or both so that position relation of the board alignment mark and the mask alignment mark displayed at the unit displaying becomes designated position relation.

11. An aligner according to claim 1, wherein the unit detecting the board alignment mark and the unit detecting the mask alignment mark include a CCD camera.

12. An aligner according to claim 1, wherein the photo mask is a glass mask.

13. An aligner according to claim 1, wherein the photo mask is a glass mask putting a photo mask of film base on a glass.

* * * * *